United States Patent
Simpson

(10) Patent No.: US 9,709,654 B2
(45) Date of Patent: Jul. 18, 2017

(54) SIGNAL MEASUREMENT SYSTEMS AND METHODS

(71) Applicant: Maury Microwave, Inc., Ontario, CA (US)

(72) Inventor: Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 233 days.

(21) Appl. No.: 14/461,668

(22) Filed: Aug. 18, 2014

(65) Prior Publication Data

US 2015/0073749 A1   Mar. 12, 2015

Related U.S. Application Data

(60) Continuation of application No. 13/292,075, filed on Nov. 8, 2011, now Pat. No. 8,810,257, which is a continuation of application No. 12/477,851, filed on Jun. 3, 2009, now abandoned, which is a division of application No. 11/419,691, filed on May 22, 2006, now Pat. No. 7,548,069.

(60) Provisional application No. 60/689,405, filed on Jun. 10, 2005.

(51) Int. Cl.
*G01R 35/00* (2006.01)
*G01R 27/28* (2006.01)
*G01R 27/04* (2006.01)
*G01R 31/28* (2006.01)

(52) U.S. Cl.
CPC .......... *G01R 35/005* (2013.01); *G01R 27/04* (2013.01); *G01R 27/28* (2013.01); *G01R 31/2822* (2013.01); *G01R 31/2837* (2013.01); *G01R 31/2839* (2013.01)

(58) Field of Classification Search
CPC ...... G01R 27/16; G01R 35/005; G01R 27/04; G01R 27/28; G01R 31/2822; G01R 31/2839
USPC ......................................... 324/601, 650, 637
See application file for complete search history.

(56) References Cited

U.S. PATENT DOCUMENTS 7,053,628 B1 *  5/2006  Tsironis ............. G01R 31/2841
                                                         324/637

\* cited by examiner

*Primary Examiner* — Amy He
(74) *Attorney, Agent, or Firm* — Larry K. Roberts

(57) ABSTRACT

A measurement system and method for conducting measurements on a device-under-test (DUT). The system includes, in one embodiment, a passive impedance controlling tuner, and a signal transmission line, the tuner including a signal transmission line segment as at least part of the signal transmission line. A signal coupling device is coupled in a non-contacting relationship to the signal transmission line between a signal port of the DUT and the tuner for sampling signals propagating between the passive impedance controlling tuner and the DUT to allow measurement of an actual impedance presented to the DUT with the DUT in place in the measurement system during measurement of DUT characteristics. Measurement system equipment receives response signals from the signal coupler. The measurement system is configured to conduct measurement of DUT characteristics without pre-characterizing the impedance controlling tuner.

14 Claims, 8 Drawing Sheets

SIGNAL MEASUREMENT SYSTEMS AND METHODS

CROSS-REFERENCE TO RELATED APPLICATION

This application is a continuation of application Ser. No. 13/292,075, filed Nov. 8, 2011, in turn a continuation of application Ser. No. 12/477,851, filed Jun. 3, 2009, which is a division of application Ser. No. 11/419,691, filed May 22, 2006, which claims the benefit under 35 USC Section 119(e) of provisional application Ser. No. 60/689,405 filed Jun. 10, 2005, the entire contents of which applications are incorporated herein by this reference.

BACKGROUND

A Radio Frequency (RF) measurement system is one that measures something about a Device Under Test (DUT) by sampling and measuring signals applied to and coming from the DUT. A vector measurement system will measure both magnitude and phase information, while a scalar measurement system will measure magnitude only.

A "signal analyzer" measures properties of a signal relative to itself, such as magnitude or phase vs. frequency or time. A "network analyzer" measures properties of a signal at a specific reference plane, so that many of the measured signal properties can be related to characteristics of the DUT itself.

In this document, a "tuner system" will refer to a RF measurement system which uses some kind of tuner or tuners to control impedance seen by the DUT.

An "automated tuner" may be computer controlled; a "manual tuner" is controlled manually by the user.

A "passive tuner" controls the impedance seen by the DUT by changing hardware settings which affect the passive reflection. The maximum reflection is limited by the physical hardware and losses between the tuner and the DUT.

An "active tuner" controls the impedance seen by the DUT by feeding a signal back into the DUT with a specific magnitude and phase relative to the signal from the DUT. The impedance seen by the DUT will result from a combination of the passive reflections in the circuit and the "active" signal fed back to the DUT. In principle, the maximum effective reflection can be up to or even greater than unity. In practice, this is limited by the amount of power generated by the measurement system that can be fed back to the DUT to synthesize that impedance.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
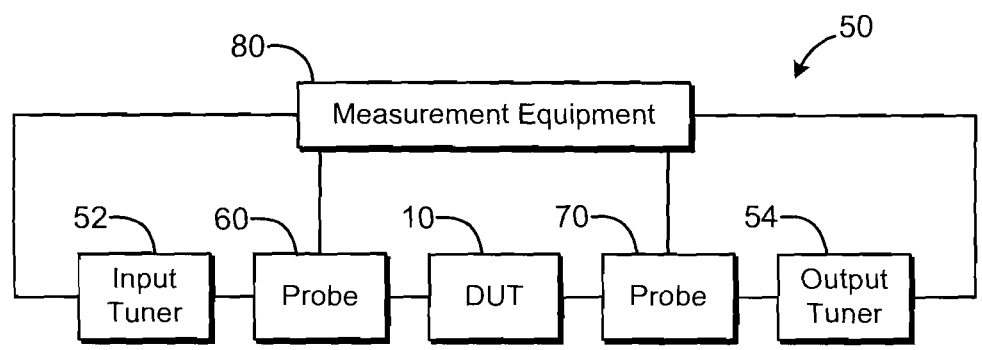
FIG. 1 is a simplified block diagram of an exemplary embodiment of a measurement system employing couplers.

In the following detailed description and in the several figures of the drawing, like elements are identified with like reference numerals. The figures are not to scale, and relative feature sizes may be exaggerated for illustrative purposes.

An exemplary embodiment of a passive measurement system 50 employing couplers is depicted in the simplified block diagram of FIG. 1. The system 50 is for conducting measurements on a DUT 10, which may be, for example and without limitation, power transistors, power FETs or other power amplifying devices, small-signal low noise transistors (e.g. FET, HEMT, PHEMT) or other amplifying devices, frequency translating devices such as frequency multipliers, and three-terminal devices such as mixers. An input coupler 60 is connected between an input port of the DUT and an input tuner 52. An output coupler 70 is connected between an output port of the DUT and an output tuner 54. The tuner systems may be, for example, a model MT980F13 tuner system for power and noise measurement from Maury Microwave using MT982E tuners. Measurement equipment 80 provides the excitation signals to the input tuner 52, and receives response signals from the couplers 60, 70 and the output tuner 54.

Figure 2:
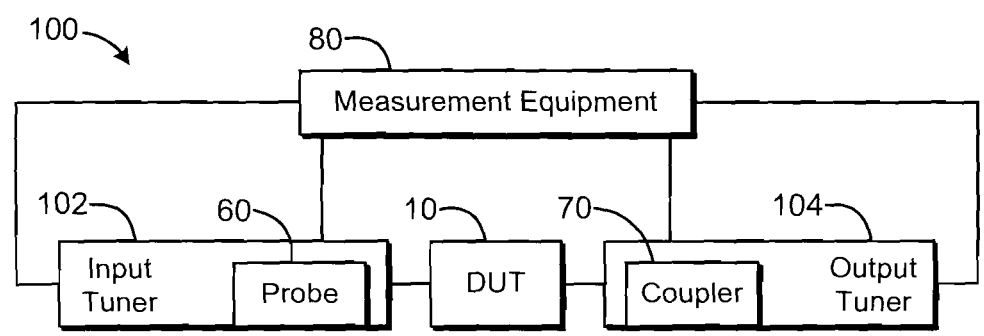
FIG. 2 depicts an alternate embodiment of a passive measurement system in which couplers are located inside the tuners

In the embodiment of FIG. 1, the couplers are located on the DUT side of the respective tuners. FIG. 2 depicts an alternate embodiment of a passive measurement system 100 in which the couplers 60, 70 are located inside the tuners 102, 104.

The couplers 60, 70 are typically mounted in a fixed position, and thus are not movable relative to the DUT.

Figure 3:
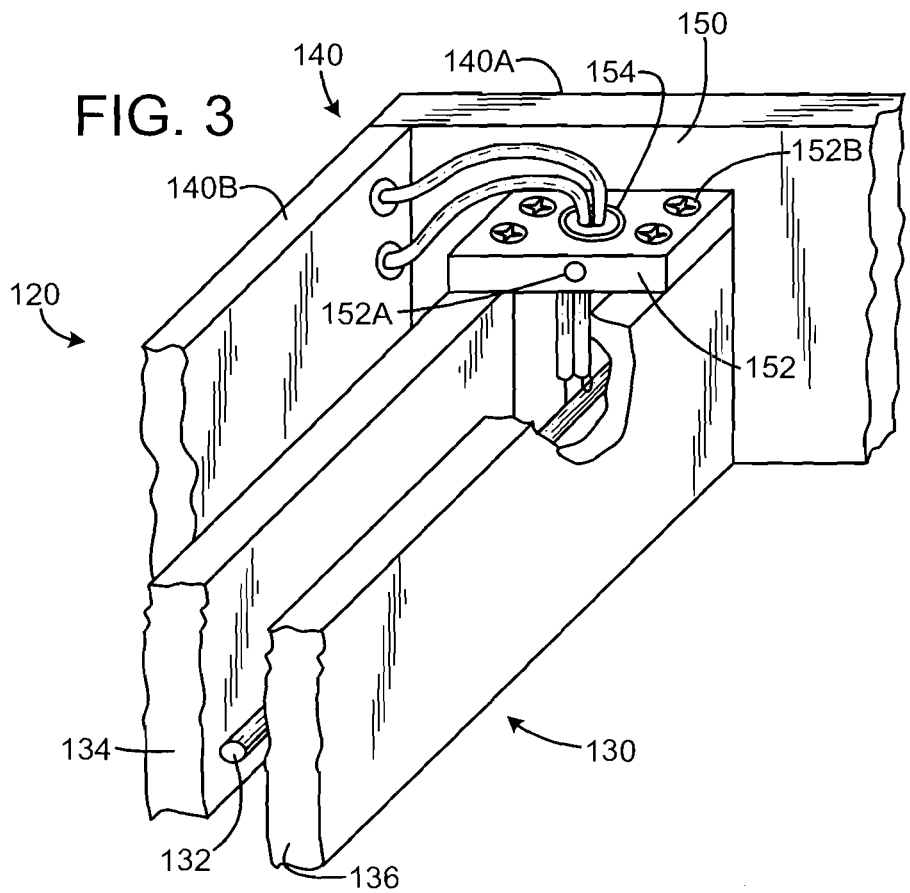
FIG. 3 illustrates a cut-away isometric view of a portion of an exemplary arrangement of a probe coupler installed in a slab line type of tuner.

FIG. 3 illustrates a cut-away isometric view of a portion of an exemplary arrangement of a probe coupler set in a slab line type of tuner 120, such as a model MT982E marketed by Maury Microwave, Ontario, Calif. The tuner includes a slabline transmission line structure 130, which comprises a center conductor 132 and opposed ground plane structures 134, 136. A panel or support structure 140 includes an end panel 140A, attached to ends of the respective ground plane structures 134, 136. A distal end of the center conductor 132 is passed through an opening in the end plate to a DUT connector. The apparatus further includes a probe coupler set 150 mounted through an opening 154 in a bracket 152, affixed across the ground plane structures 134, 136. A set screw 152A fixes the position of the probes in the bracket, which may include a probe bushing described below.

Figure 4A:
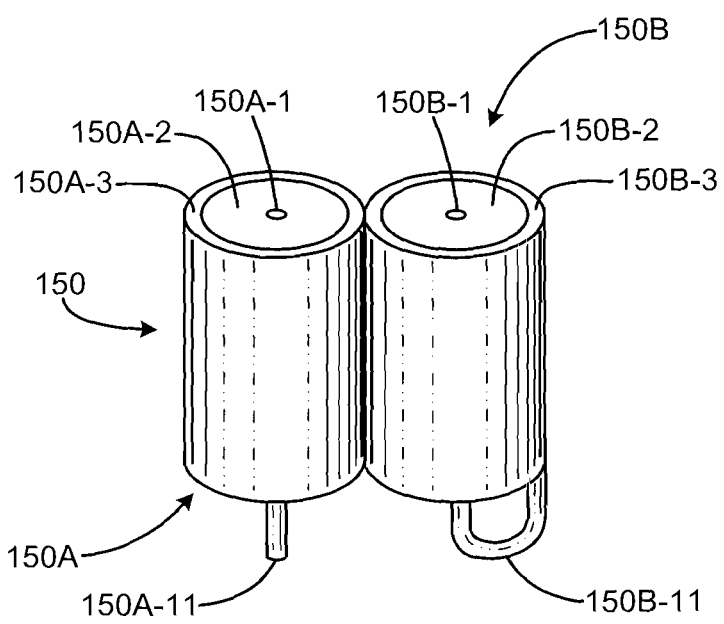
FIG. 4A illustrates a probe end of an exemplary coaxial probe set in isometric view.

The probe set 150 includes a pair of coaxial probes 150A, 150B. FIG. 4A illustrates a probe end of the probe set 150 in isometric view. Probe 150A is a capacitive probe, including a center conductor 150A-1, a dielectric sheath 150A-2, and an outer conductive shield 150A-3. An exposed end 150A-11 of the center conductor extends beyond the outer shield, and is positioned closely adjacent to, but not in contact with, the center conductor 132 of the slabline structure. The second coaxial probe 150B is an inductive probe, and similarly includes a center conductor 150B-1, a dielectric sheath 150B-2 and a conductive outer shield 150B-3. For the current probe, the exposed end of the center conductor is bent around and the tip brought into contact with the outer shield 150B-3 to form an inductive loop. The tip end may be attached, e.g. by soldering, to the outer shield. The spacing between the probes and the center conductor may be adjusted or selected to achieve the desired coupling value. Positioning the probes closer to the center conductor results in tighter coupling (e.g. more signal coupled out), and farther from the center conductor results in looser coupling (e.g. less signal coupled out). This may easily be set empirically while monitoring the display of a network analyzer connected from the center conductor input to the probe connector output, with the other end of the center conductor terminated in 50 Ohms.

Figure 4B:
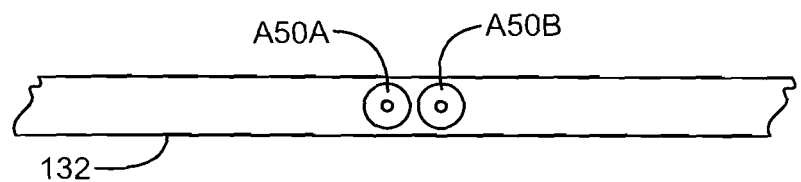
FIG. 4B is a diagrammatic view illustrating a transverse position of the probes relative to the tuner center conductor.
Figure 4C:
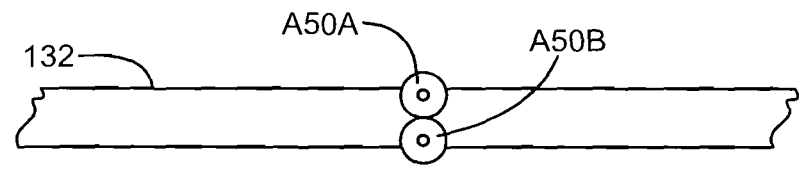
FIG. 4C is a diagrammatic view illustrating a serial position of the probes along the center conductor.

The probe 150 in an exemplary embodiment, for a 7 mm tuner with a center conductor diameter of 0.1197 inch, may be fabricated of 0.085 inch diameter semi-rigid coaxial cable. In one exemplary embodiment, the center conductor protruded from the shield by about one diameter of the cable; this dimension can also be adjusted or varied to affect the coupling value and the frequency response. One exemplary spacing range, for the spacing of the probe tips from the tuner center conductor, is 0.050 inch to 0.150 inch. In an exemplary embodiment, the probes 150A, 150B are mounted in the bracket 152 such that the center conductors of each probe are in the same plane perpendicular to the axis of the center conductor 132. This arrangement is illustrated in FIG. 4C. In another embodiment, the probes are mounted in the bracket 152 such that the center conductors of each probe are in a plane coincident with the center conductor, as illustrated in FIG. 4B. In each embodiment, the loop of the inductive probe should preferably be oriented so that it is parallel to the center conductor of the tuner.

In an exemplary embodiment, the distal ends of the probe cables are brought out to connectors mounted in side plate 140B for connection to, e.g. a measurement equipment such as measurement equipment 80 (FIG. 2).

Figure 5A:
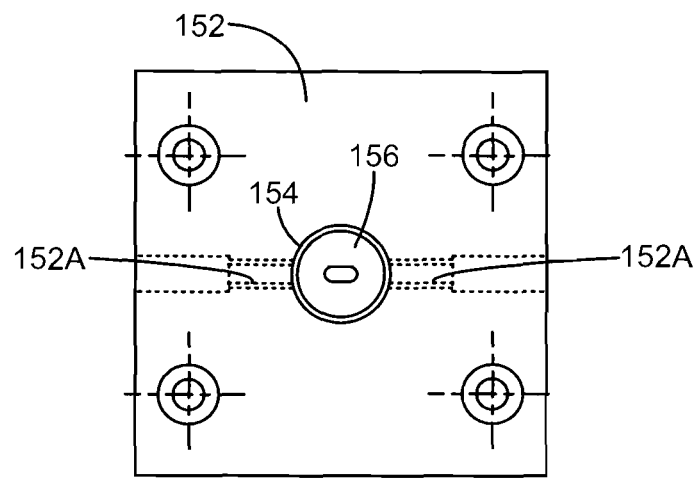
FIGS. 5A and 5B illustrate respectively an embodiment of a probe bracket and a probe bushing.
Figure 5B:
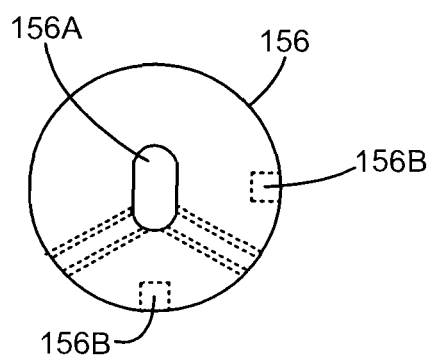

The bracket 152 is fixed in position relative to the slabline structure, e.g. by threaded fasteners 152B. The bracket 152 and a probe bushing 156 are illustrated in FIGS. 5A and 5B. In an exemplary embodiment, the probe set 150 is held in a slot 156 formed in the bushing 156. The bushing may be rotated within the hole 154 to position the probes at either the position shown in FIG. 4B or the position shown in FIG. 4C, with set screws 156B securing the bushing at the selected location in the bracket hole.

Figure 6:
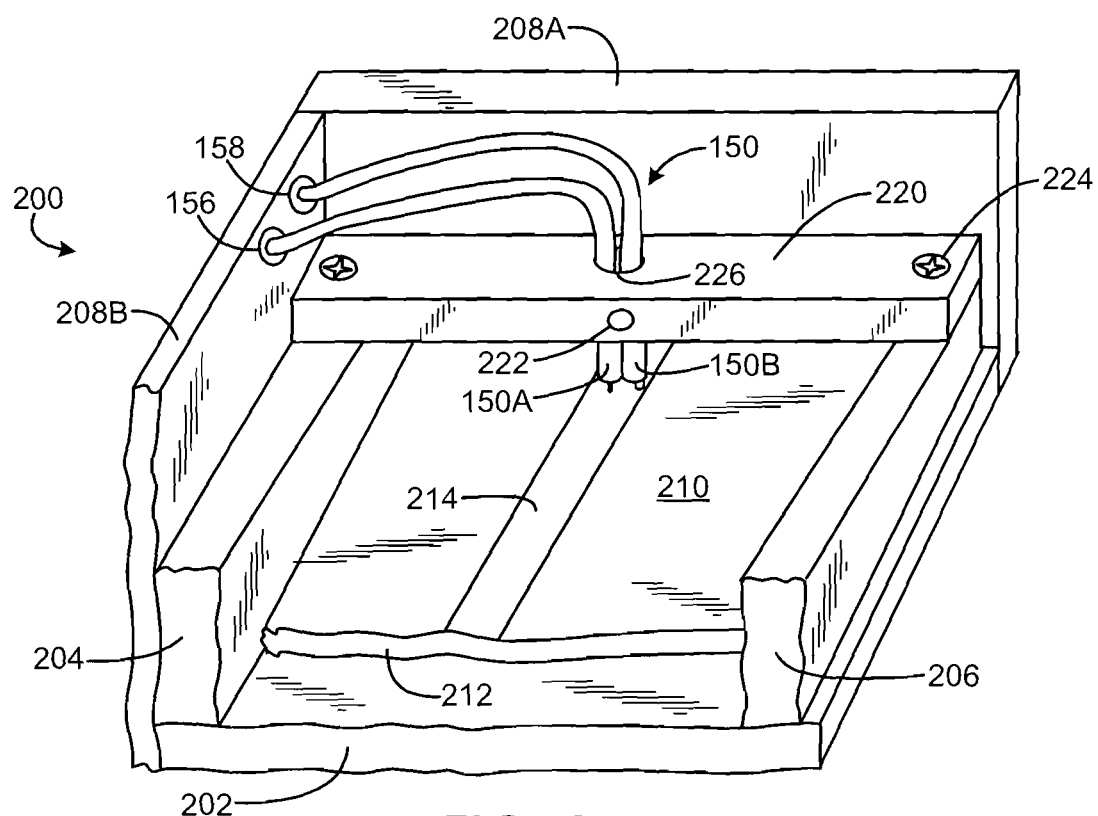
FIG. 6 illustrates an exemplary implementation of a probe coupler in a microstrip-style solid state tuner.

Another exemplary embodiment of an installation of a probe coupler in a tuner is the tuner 200 depicted in the isometric cut-away view of FIG. 6. The exemplary tuner here is a microstrip-style solid state tuner, such as the model NP5 or LP2 model tuner marketed by Maury Microwave. A microstrip transmission line 210 is formed by dielectric substrate 212 disposed on a ground plane 202 of the housing, and a center conductor trace 214 on the top surface of the substrate 212. The distal end of the conductor trace 214 is connected to a DUT connector (not shown in FIG. 5) on the outside of panel 208A.

A probe mounting bracket 220 is supported above the microstrip transmission line by housing brackets 204 and 206. A probe set 150 is mounted through opening 226 in the bracket, and includes a pair of coaxial probes as with the embodiment of FIG. 4A. A set screw 222 may be used to fix the probe set in position in the opening 226. Threaded fasteners 224 may fix the bracket 220 to the brackets 204, 206. The distal ends of the coaxial cables from the probes are connected to panel mount connectors 156, 158 on panel 208B.

As with the embodiment of FIG. 4A, the probes 150A, 150B of the embodiment of FIG. 6 are positioned in the mounting bracket 220 such that the center conductors of the probes are disposed in a plane perpendicular to the longitudinal extent of the center conductor trace 214. In another embodiment, the probe center conductors may be positioned in series along the trace 214, analogous to the orientation depicted in FIG. 4B. The inductive probe is positioned preferably so that the loop is oriented parallel to the center conductor trace 214.

Figure 7:
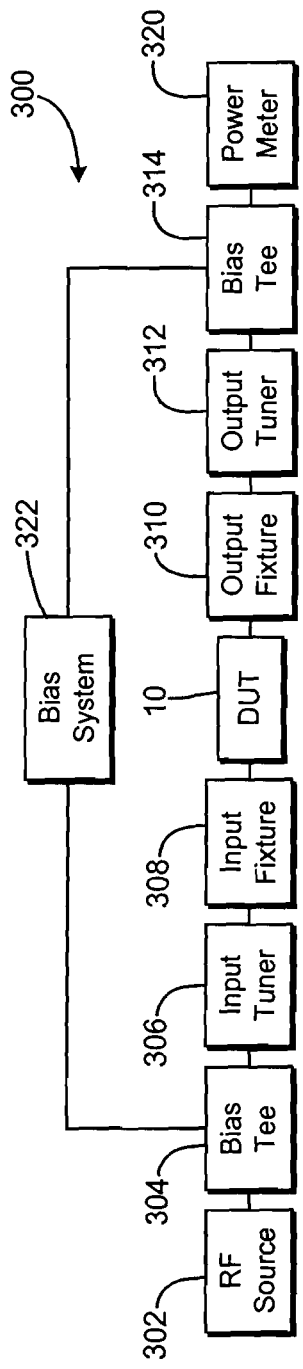
FIG. 7 is a simplified block diagram of an exemplary load pull measurement system capable of measuring output power, transducer gain, and efficiency.

FIG. 7 is a simplified block diagram of an exemplary load pull measurement system 300 capable of measuring output power, transducer gain, and efficiency. An RF source 302 supplies an RF drive signal through a bias Tee 304, an input tuner 306, and an input fixture 308 to an input port for the DUT 10. The response of the DUT at an output port is passed through the output fixture 310, the output tuner 312 and the bias Tee 314 to the power meter 320. A bias system 322 applies a bias to the bias Tees 304, 314. Non-RF elements of the system have been omitted, e.g. the computer that controls and automates the measurements is not shown in FIG. 7. One example of a commercially available tuner suitable for use as tuner 306 and for tuner 312 is the model MT982E tuner available from Maury Microwave. The fixtures 308, 310 are normally used to connect the DUT (however it is packaged) to a coaxial reference plane. The input and output fixtures are usually supplied by the user to fit the particular device to be measured. Wafer probes, sold by Cascade Microtech are very common examples. Another example is a fixture for small packaged devices, the model MT950, marketed by Maury Microwave; this exemplary fixture contains both the input and output.

There are many variations possible for load pull measurement systems. For example, the input and output fixtures 308, 310 are both optional. Additional tuners can be added for pre-matching or harmonic tuning. Either the source or load tuner could be omitted. A variety of other equipment could be added, including but not limited to additional power meters, spectrum analyzers, vector signal analyzers, RF switches, vector network analyzers, large signal analyzers, or a noise figure meter. Different configurations can allow different sets of measured parameters, measurement speed differences, or different measurement accuracy, for example. The load pull system is often used to measure large signal parameters of power devices, which may be nonlinear. However load pull in general would also include other applications that use impedance tuning, such as small signal, noise parameter characterization, or DC-IV characterization with control of the termination impedances.

Figure 8:
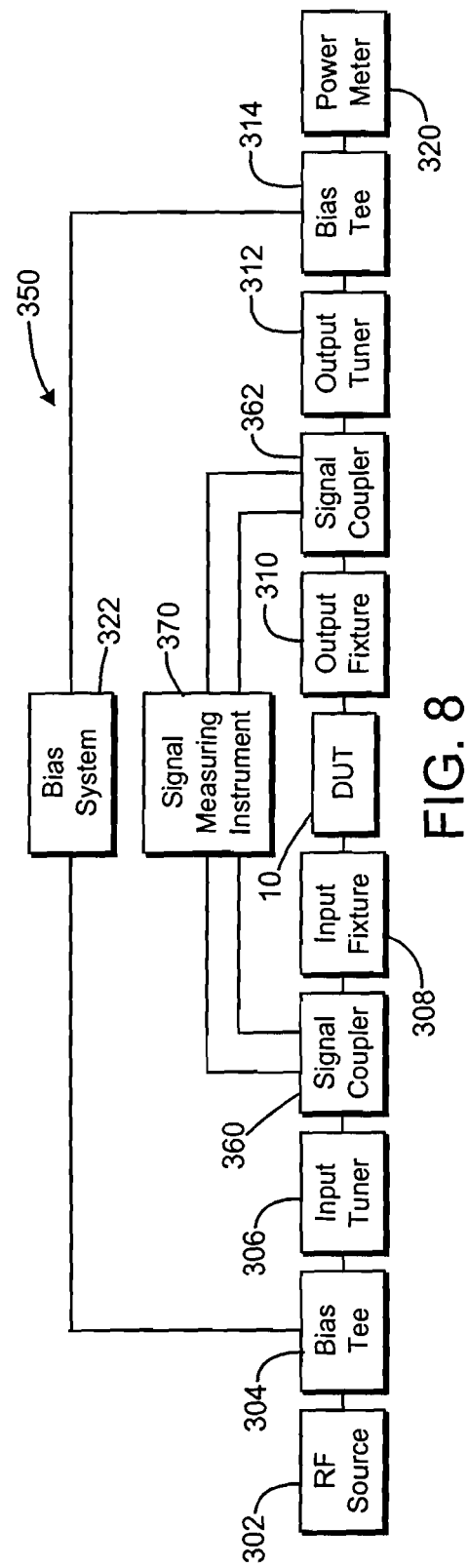
FIG. 8 is a simplified block diagram of an exemplary load pull measurement system, similar to that of FIG. 7, but with signal couplers added between the tuners and the DUT.

FIG. 8 is a simplified block diagram of an embodiment of an exemplary load pull measurement system, similar to that of FIG. 7, but with signal couplers 360, 362 added between the tuners and the DUT 10. A signal measurement instrument 370 receives the signals from the signal coupler probe elements, e.g. the coaxial probes of probe set 150. The same variations mentioned about the system of FIG. 7 would apply here also. The signal measuring instrument 370 may be selected based on the desired measured data, but examples include but are not limited to a vector network analyzer (VNA) or a large signal network analyzer (LSNA).

Figure 9A:
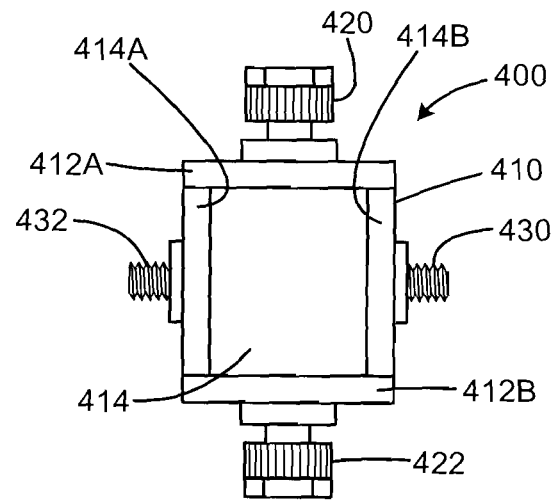
FIGS. 9A-9B illustrate an embodiment of a probe coupler mounted in a separate housing structure.
Figure 9B:
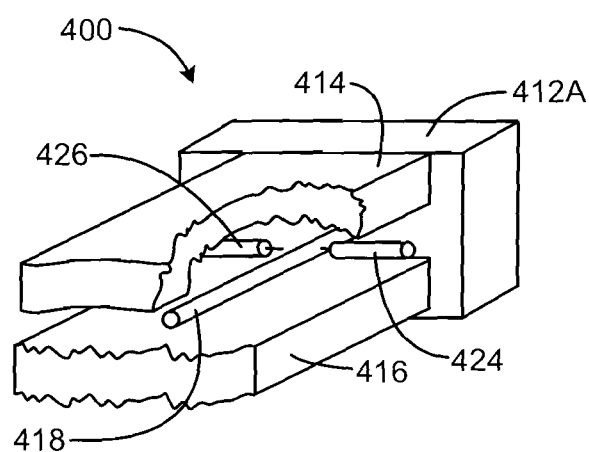

FIGS. 9A-9B illustrate an embodiment of a probe coupler mounted in a separate housing structure. The coupler 400 includes an exemplary embodiment of a separate housing structure for signal probes using slab-line construction. The housing structure 410 includes end plates 412A and 412B, side plates 414A, 414B, and top and bottom ground planes 414, 416. A center conductor 418 is connected between input and output connectors 420, 422 mounted in respective end plates 412A, 412B. In an exemplary embodiment, the connectors 420, 422 are 7 mm coaxial connectors. The coupler 400 includes inductive and capacitive coaxial couplers 424, 426 having respective connector ends connected to and supported by connectors 430, 432, which are mounted in the respective side plates 414B, 414A. In an exemplary embodiment, the connectors 430, 432 are 3.5 mm coaxial female connectors. The probe ends of the center conductors of the probes are positioned adjacent to but not in contact with the slab-line center conductor 418, as discussed above regarding coupler set 150. In this exemplary embodiment, the probes are mounted in the same plane relative to the center conductor 418, but on opposite sides of the center conductor, 180 degrees apart.

Figure 10A:
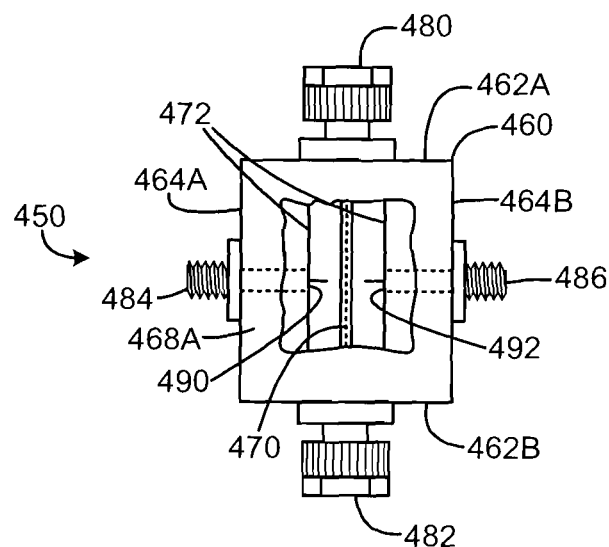
FIGS. 10A-10B illustrate another embodiment of a probe coupler mounted in a separate housing structure.
Figure 10B:
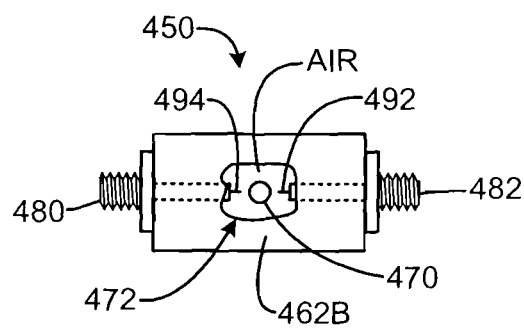

FIGS. 10A-10B illustrate another embodiment of a probe coupler mounted in a separate housing structure. FIG. 10A is a top, partially broken-away view of a probe coupler; FIG. 10B is an end view. The probe coupler 450 includes a separate housing structure 460, fabricated from a solid metal rectangular block, for a coaxial transmission line comprising a center conductor 470 and an outer conductive shield surface 472 formed by boring an opening in the rectangular housing block. The housing structure 460 includes end surfaces 462A, 462B, side surfaces 464A, 464B, a top surface 468A and a bottom surface. Coaxial input and output connectors 480 and 482 are mounted to the respective end surfaces 462A, 462B, and are connected to the coaxial center conductor 470. In an exemplary embodiment, the connectors 480, 482 may be 7 mm coaxial connectors. A capacitive coaxial probe 490 is passed through an opening in the housing block 460 and the outer shield surface 472 so that the capacitive probe tip is adjacent to but not in contact with the center conductor 470. An inductive probe 492 is passed through another opening in the housing block 460 and outer shield surface 472 so that the inductive loop tip is adjacent to, but not in contact with, the center conductor 470. The probes are electrically connected to respective coaxial connectors 484, 486, mounted on side surfaces 464A, 464B.

Probe couplers have been used for s-parameter measurements with a Vector Network Analyzer (VNA). The two coupling probes were connected to the VNA samplers as if they were the ports of distributed transmission line type couplers that are normally used in VNA Test Sets. There are two principle problems with this.

The VNA error correction math, which is well known, is based on the assumption that the signals sampled are roughly proportional to the incident and exiting (reflection or transmission) waves at each port. With probe couplers, the outputs were proportional to voltage and current, not the waves. This can cause the VNA error correction math to become ill-conditioned, and make the error correction work poorly.

Many VNA's use the incident signal for a second purpose besides collecting data, and that is to phase lock the RF source. The incident signal is used because it normally never goes to zero. However, either a voltage or current signal will go to zero or nearly so under many normal conditions. For example, when a calibration standard such as a short is connected, the voltage or current signals will go to zero or nearly so at certain phase values. If a wide frequency range is swept, then this condition will almost always occur at some frequency, and maybe at multiple frequencies.

In an exemplary embodiment, these problems may be addressed in the following manner.

a) The sampled signals will be assumed to be roughly proportional to voltage and current. After they are sampled and detected, the signal values will be converted into values proportional to incident and exiting waves (a and b waves for each port) using equations 1 and 2. The new modified signal values (a and b values for each port) can then be used in the VNA correction math robustly. This solution will also work with a Large Signal Network Analyzer (LSNA) such as the Maury MT6643 as well as with a VNA.

$$a_n = (v_n + i_n Z_0)/2 \qquad \text{equation 1}$$

$$b_n = (v_n - i_n Z_0)/2 \qquad \text{equation 2}$$

where n=port number, $Z_0$=characteristic impedance of the transmission line, $v_n$=voltage at port n, $i_n$=current at port n, $a_n$=incident wave at port n, and $b_n$=exiting wave (reflected or transmitted) at port n.

Variations of these equations may be alternatively be used. For example, often all that is needed is a value proportional to the signal, because scaling is done later in the correction, or all that is needed are ratios (such as with s-parameters). In that case, the denominator can be ignored.

b) The coupling probes are still placed relatively near the DUT, but the phase lock (or leveling) signal is taken close to the RF source with a separate power splitter or distributed coupler where the loss is not so critical. This would provide the more constant signal required for that purpose. This solution will also work with an LSNA or other instruments that require a phase or leveling reference signal.

Subject matter described herein may address one or more of the following problems.

1. The coupler is very small, so is easier to mount in tight or sensitive locations near the DUT, with or without tuners.
2. The coupler is very broadband, and works down to low RF frequencies without growing in size. This is ideal for signal analyzer or network analyzer applications, including the LSNA.
3. The coupler introduces very little loss, so it may be placed between the DUT and the tuner without degrading the tuner matching range.
4. Putting the coupler between the DUT and the Tuner allows:
   a. The signal at the DUT, including the harmonics, to be measured before the signal blockage of the tuner.
   b. Placing the coupler between the DUT and the tuner will allow harmonic tuning to be used with the LSNA. It will work with any current harmonic tuning method.
   c. The impedance seen by the DUT may be measured real-time in-situ, meaning at the same time as the other measurements are made. That greatly reduces or eliminates the need for time consuming pre-characterization of system components.
   d. Without pre-characterization, the need for high tuner repeatability is greatly reduced.

e. Without the need for such high repeatability, manufacturing costs can be reduced.
f. Without pre-characterization, there are fewer errors that can occur.
g. Without pre-characterization, the measurement setup is much simpler, making errors less likely.
h. Without pre-characterization, the RF measurement system may be setup, and very quickly used to make DUT measurements.
5. The coupler device in this general application may be mounted in a stable, fixed mounting.
6. The coupler in this application may be mounted inside a tuner, eliminating the need for extra hardware blocks in the system.
7. The coupler in this application may reduce costs.
8. The coupler may have an extended bandwidth. The coaxial probe set 150 may have a broad bandwidth, e.g. from a few Megahertz up to the maximum bandwidth of the transmission line into which it is mounted. In contrast, conventional distributed couplers have limited bandwidth based on the transmission line lengths used in the couplers and the number of sections employed. A 1-section coupler covers a fairly narrow band. Adding sections can increase the bandwidth, but this also directly increases the size and losses.

Signal coupling devices may be applied to measurement systems that use passive tuners for reflection control by connecting the coupling device between the DUT and the passive tuner.
a. The signal coupling device so applied may be any type of device capable of signal sampling. Examples include a directional coupler (coaxial or waveguide), a directional bridge, a voltage-current probe, or a directional current probe. One particular example is the probe set 150 described above.
b. The passive tuners may be manually controlled, or may be automated with computer control.
c. The signal coupling device may be used to measure the reflection coefficient created with a passive tuner during the measurement, with the wave sensing device connected between the DUT and the passive tuner.
d. In an exemplary embodiment, the reflection created by the passive tuner may be measured at any desired state without previously calibrating the tuner at multiple states.
e. The signal coupling device may be used to measure reflection or transmission properties of a DUT.
f. The signal coupling device may be used to measure signals coming from or going to a DUT.

A low-loss, electrically small probe, an exemplary embodiment of which is the probe set 150, may be applied as a signal coupling device to measurement systems that use passive tuners for reflection control.
a. The low-loss probe so applied may be the voltage-current probe set 150. It also may be configured or constructed in a variety of other ways, including but not limited to a pair of voltage probes with a phase offset between them, or a pair of current probes with a phase offset between them. Note: when two similar probes are used, the ideal separation along the tuner center conductor would 90 degrees of transmission phase (quarter wave), but may be usable in many applications over some range. A rule of thumb for the usable range would be a transmission phase over the range of about 10 degrees to 170 degrees.
b. The low-loss probe may be built into the passive tuner housing.
c. The probe may be built into a separate housing and connected to the tuner. The separate housing does not need to be connected directly to the tuner, but may be connected through coaxial cables, waveguide, or other devices capable of transmitting the signal.
d. If a 2-port tuner is used in the measurement system, the low-loss probe may be placed on the side of the tuner near the DUT, or on the side of the tuner away from the DUT.
e. If a 1-port tuner is used in the measurement system, the low-loss probe may be connected between the DUT and the tuner.
f. If the low-loss probe is connected between the DUT and the tuner, the reflection created by the tuner at any desired state may be measured without pre-calibrating the tuner at multiple states.
g. The passive tuners may be manually controlled, or may be automated with computer control.
h. The low-loss probe may be used to measure reflection or transmission properties of a DUT.
i. The low-loss probe may be used to measure signals coming from or going to a DUT.

A fixed housing in which a low-loss, electrically small probe is permanently mounted provides advantages:
a. The fixed housing eliminates the problem with repeatability of the probe height over the main transmission line.
b. The fixed housing eliminates the problem with measurement repeatability due to misplacement of the probe along the transmission line.
c. The fixed housing eliminates the problem with coupling repeatability due to misalignment of the probe on the transmission line.
d. The fixed housing eliminates coupling variability due to variation of the main transmission line dimensions or characteristic impedance.
e. The fixed housing eliminates stability problems during the calibration process, while multiple standards are connected to the circuit.

The bandwidth of a voltage-current probe may be improved by mounting the sensors so the reference plane of the current and voltage sensors are co-planar. Regardless of the orientation of the probe pair, preferably the loop of the inductive probe is parallel to the center conductor trace.

The data correction algorithm used with a voltage-current probe may be designed to eliminate ill-conditioned data when either the voltage or current on the main transmission line becomes small at the point where the probe is sensing the signal.
a. The voltage-current probe has two sensors, each providing a signal to be measured. The new algorithm (described above regarding equations 1 and 2) treats these two sensor signals as being proportional to voltage and current on the main transmission line in the error correction math calculations.
b. One implementation of the math calculation is to convert the measured values of the two sensor signals from voltage-current signals to incident-reflected waves using equations 1 and 2.
The resulting a and b values are then used in the error correction commonly used in Vector Network Analyzer (VNA) measurements.
c. The math implementation may be done in different ways, depending on how the equations are combined or manipulated with the equations with VNA error correction equations.

d. Although error correction in a VNA is used here as an example, this improved algorithm is not limited only to a VNA. It may be used with any measurement system that samples a signal from a main transmission line.

e. Conventionally, the measured values of the two sensor signals were used directly in the error correction used in a VNA. Although it can be corrected in principle by the VNA error correction routine, the data could become ill-conditioned when the average voltage or current value on the main transmission line became very small at the reference plane of the probe. The ill-conditioned data causes the calculation to be very sensitive to small errors, and the residual error after correction may become significant.

In accordance with one embodiment, signal coupling devices may be applied to load pull systems that use passive tuners for reflection control by connecting the coupling device between the DUT and the passive tuner.

a. In general, a load pull system is one where impedance is controlled or varied, and a set of parameters is measured for each measurement condition. The impedance control is typically done with impedance tuners of some type. There are many types of passive impedance tuners, including but not limited to slide-screw tuners, double slug tuners, stub tuners, and solid state tuners using PIN diodes or other solid state control devices. The passive tuners may be manually controlled, or may be automated with computer control.

b. The signal coupling device so applied may be any type of device capable of signal sampling. Examples include a directional coupler (coaxial or waveguide), a directional bridge, a voltage-current probe, or a directional current probe, including the probe set 150 described above.

c. The signal coupling device is used to sample signals between the DUT and passive tuner, in order to measure the signal applied to or coming out of the DUT as required by the load pull application, and to measure the reflection coefficient created with a passive tuner during the measurement.

d. The reflection created by the passive tuner may be measured at any desired state without previously calibrating the tuner at multiple states.

e. If the tuner was previously calibrated, the reflection created by the passive tuner can be measured at any desired state and compared to the calibrated data as a verification that the system is working correctly, and also to give an indication of system measurement accuracy. The pre-calibration data may also be used to determine tuning settings prior to the actual measurement with the DUT.

f. The signal coupling device may be used to measure reflection or transmission properties of a Device Under Test (DUT), by measuring incident and reflected or transmitted signals, and applying the appropriate math, such as the complex ratio of the output signal to the input signal, for example.

In accordance with another embodiment, a low-loss, electrically small probe may be applied to load pull systems that use any type of impedance tuning for reflection control by connecting the coupling device between the DUT and the controlled impedance.

a. This applies to measurement systems that use passive impedance tuning or active impedance tuning. As noted above, there are many types of passive impedance tuners, including but not limited to slide-screw tuners, double slug tuners, stub tuners, and solid state tuners using PIN diodes or other solid state control devices. Active impedance tuning may take any form where the reflection termination seen by the DUT is at least partially synthesized by injecting a signal back to the DUT. The injected signal may be created in different ways, such as from a separate source or by coupling off part of the input or output signal and feeding it back to the DUT with controlled magnitude and phase.

b. In general, a load pull system is one where impedance is controlled or varied, and a set of parameters is measured for each measurement condition. The impedance control is typically done with impedance control of some type. The tuning may be manually controlled, or may be automated with computer control.

c. The low-loss probe so applied may be the probe pair or set 150 described above. It also may be configured or constructed in a variety of other ways, including but not limited to a pair of voltage probes with a phase offset between them, or a pair of current probes with a phase offset between them. Note: when two similar probes are used, the ideal separation would 90 degrees of transmission phase (quarter wave), but may be usable in many applications over some range. A rule of thumb for the usable range would be a transmission phase over the range of about 10 degrees to 170 degrees.

d. The signal coupling device is used to sample signals between the DUT and tuning mechanism, in order to measure the signal applied to or coming out of the DUT as required by the load pull application, and to measure the reflection coefficient created by the tuner during the measurement.

e. If a 2-port tuner is used in the measurement system, the low loss signal coupling device may alternately be placed on the side of the tuner away from the DUT. In this case, the de-embedding of the measured data through the tuner to the DUT reference plane may be performed using methods currently used in traditional load pull setups.

f. The reflection created by the tuning may be measured at any desired state without previously calibrating the tuner at multiple states.

g. If the tuner was previously calibrated, the reflection created by the tuner can be measured at any desired state and compared to the calibrated data as a verification that the system is working correctly, and also to give an indication of system measurement accuracy. The pre-calibration data may also be used to determine tuning settings prior to the actual measurement with the DUT.

h. The signal coupling device may be used to measure reflection or transmission properties of a DUT, by measuring incident and reflected or transmitted signals, and applying the appropriate math, such as the complex ratio of the output signal to the input signal, for example.

i. The low-loss probe can be built into the housing of the tuning mechanism.

j. Alternatively, the probe can be built into a separate housing and connected to the tuner. The separate housing does not need to be connected directly to the tuner, but may be connected through coaxial cables, waveguide, or other devices capable of transmitting the signal.

In accordance with a further embodiment, a low-loss, electrically small probe may be applied to load pull systems that use passive tuners for reflection control by connecting the coupling device between the DUT and the passive tuner.

a. In general, a load pull system is one where impedance is controlled or varied, and a set of parameters is measured for each measurement condition. The impedance control is typically done with impedance tuners of some type. There are many types of passive impedance tuners, including but not limited to slide-screw tuners, double slug tuners, stub tuners, and solid state tuners using PIN diodes or other solid state control devices. The passive tuners may be manually controlled, or may be automated with computer control.

b. The low-loss probe so applied may be the voltage-current probe set 150. It also may be configured or constructed in a variety of other ways, including but not limited to a pair of voltage probes with a phase offset between them, or a pair of current probes with a phase offset between them. Note: when two identical probes are used, the ideal separation would 90 degrees of transmission phase (quarter wave), but may be usable in many applications over some range. A rule of thumb for the usable range would be a transmission phase over the range of about 10 degrees to 170 degrees.

c. The signal coupling device is used to sample signals between the DUT and passive tuner, in order to measure the signal applied to or coming out of the DUT as required by the load pull application, and to measure the reflection coefficient created with a passive tuner during the measurement.

d. If a 2-port tuner is used in the measurement system, the low loss signal coupling device may alternately be placed on the side of the tuner away from the DUT. In this case, the de-embedding of the measured data through the tuner to the DUT reference plane using methods currently used in traditional load pull setups.

e. The reflection created by the passive tuner may be measured at any desired state without previously calibrating the tuner at multiple states.

f. If the tuner was previously calibrated, the reflection created by the passive tuner may be measured at any desired state and compared to the calibrated data as a verification that the system is working correctly, and also to give an indication of system measurement accuracy. The pre-calibration data may also be used to determine tuning settings prior to the actual measurement with the DUT.

g. The signal coupling device may be used to measure reflection or transmission properties of a Device Under Test (DUT), by measuring incident and reflected or transmitted signals, and applying the appropriate math, such as the complex ratio of the output signal to the input signal, for example.

h. The low-loss probe can be built into the passive tuner housing.

i. The probe may be built into a separate housing and connected to the tuner. The separate housing does not need to be connected directly to the tuner, but may be connected through coaxial cables, waveguide, or other devices capable of transmitting the signal.

Figure 11:
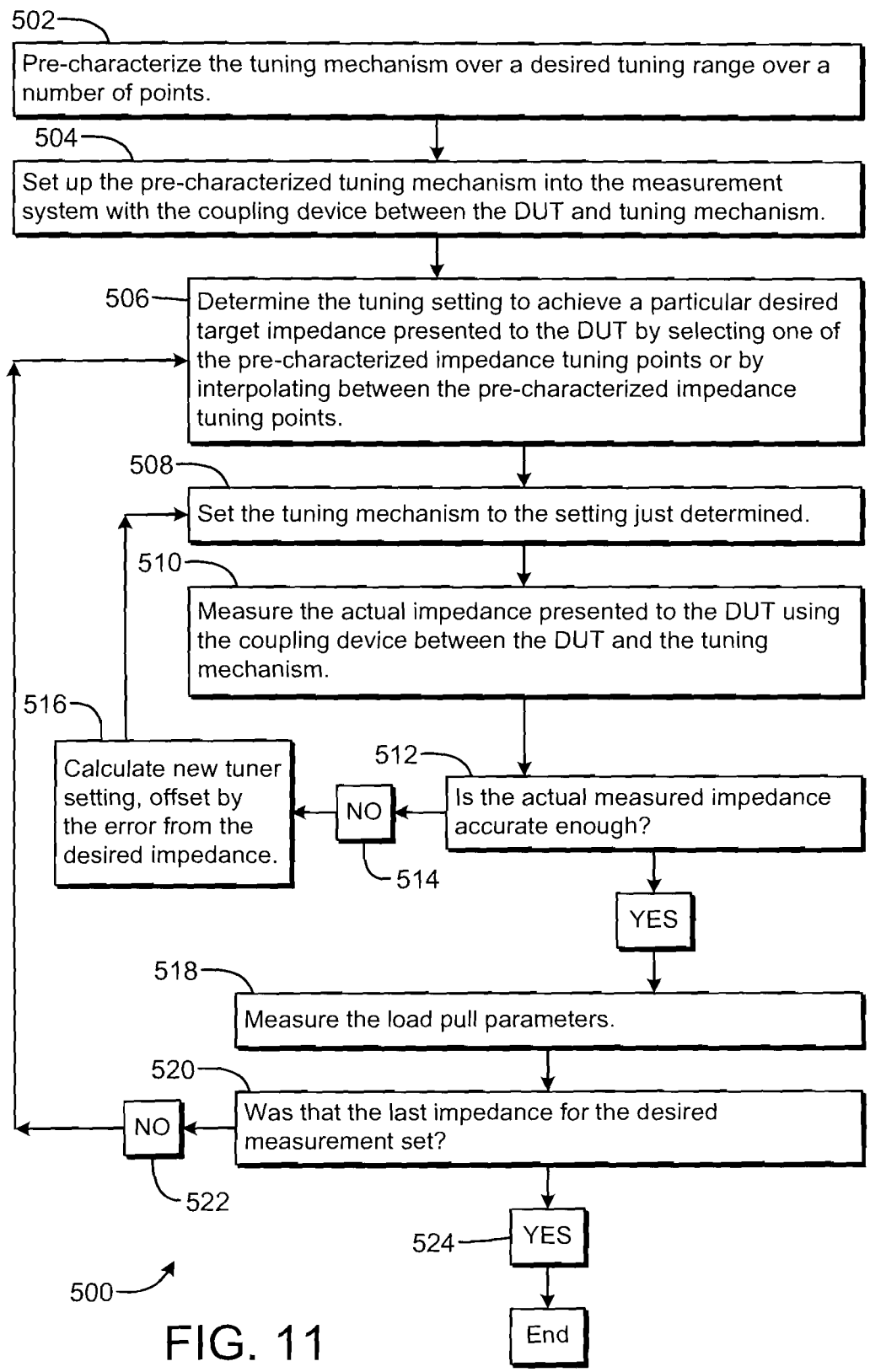
FIG. 11 is a flow diagram of an exemplary embodiment of a method for performing a measurement.

Conventional pre-characterization typically means to measure the properties of the tuner (without limitation but typically by measuring the s-parameters of the tuner) at multiple tuning settings, and saving the data for all characterized settings in a file. In accordance with another embodiment, that pre-characterization will still work, although simpler and potentially less accurate methods may also be employed, since final accuracy will be determined at measurement time, not by the pre-characterization. In accordance with another embodiment, an exemplary algorithm to select tuner settings using a signal coupler in a load pull measurement system is illustrated in flow diagram form as algorithm or method 500 in FIG. 11. At 502, the tuning mechanism, e.g. an impedance controlling tuner, is pre-characterized at a number of impedance points over a desired tuning range. This step is similar to the techniques commonly employed to pre-characterize tuners in conventional load pull systems, except that less accuracy may be obtained, since during the actual measurement, the actual reflection coefficient will be measured. And because less accuracy is obtained, the desired impedance setting may be obtained from fewer characterize positions, resulting in more rapid tuner calibration or pre-characterization.

At 504, the pre-characterized tuning mechanism is set-up in the load pull measurement system, with the signal coupling device in a signal path between the DUT and the tuning mechanism. It is to be understood that the steps 502 and 504 may be reversed in order, in that the tuning mechanism may be installed in the measurement system and pre-characterized in situ. At 506, a tuning setting for the tuning mechanism is determined in order to achieve a particular desired or target reflection termination for the DUT, e.g. by selecting one of the pre-characterized tuning points or by interpolating between the pre-characterized impedance tuning points, and the tuning mechanism is adjusted to this tuning setting at 508. The actual reflection coefficient seen by the DUT is measured, using the signal coupling device between the DUT and the tuning mechanism (510). If at 512, 514, the difference (error) between the target reflection coefficient and the measured coefficient is larger than desired for the particular application, then a new tuner setting is calculated at 516, offset by the error from the desired impedance. Steps 508 and 510 are repeated, and the process iterated. At 518, the load pull parameters are measured, and the process repeats if additional impedances are to be measured for the desired measurement set. Of course, other embodiments of exemplary algorithms may include a different number of loops or nested loops employed to control multiple impedance variables or other independent variables, e.g. in a manner similar to sweep plan loops employed in conventional load pull systems, An exemplary algorithm may include the following:

a. This algorithm applies, in an exemplary embodiment, to a load pull system where the coupling device is connected in a way to allow measurement of the reflection coefficient presented to the DUT with the DUT in place. One implementation of this is to connect the signal coupling device between the DUT and the tunable impedance.

b. The tuner mechanism may be pre-characterized over some desired tuning range in a manner similar to pre-characterizing tuners in current, traditional load pull systems, except for the following:

1) Less accuracy may be required, because during the actual measurement, the actual reflection will be measured. Only an approximate reflection coefficient is normally required for this impedance setting algorithm.

2) Because less accuracy may be required, the desired impedance setting can be interpolated from fewer characterized positions. Fewer characterized points result in a quicker tuner calibration.

c. At measurement time, the impedance tuning setting may be determined by selecting one of the calibrated impedance points, or by interpolating between the calibrated impedance tuning points, to achieve a particular desired target impedance presented to the DUT. The advantage of this is that one will not normally have to hunt for the desired impedance at measurement time, except for fine tuning in special cases. Note: the process of actually interpolating between calibrated impedance points is already implemented in commercial load pull systems.

d. After the tuning setting is determined and set, the actual impedance achieved by that setting will be measured. In most load pull measurement situations, the exact impedance is not critical as long as it is known, so the system is then ready to measure the normal load pull parameters.

e. If the exact impedance setting is critical and the actual measured impedance is not close enough, a new impedance offset by the error from the desired impedance may be determined and set, and the actual impedance re-measured. This process can be iterated until a sufficient accuracy is achieved.

One embodiment of a simpler characterization is to characterize a tuner over its specified frequency and tuning range, and use curve fitting techniques to mathematically model that tuner vs. Tuning position and vs. Frequency. The initial characterization may be done as discrete points, and the mathematical model would allow interpolated data for any point.

Another embodiment of a simpler characterization is to develop a general characterization for all tuners of a specific model number. This may be accurate only to the unit to unit repeatability in the manufacturing process.

Although the foregoing has been a description and illustration of specific embodiments of the subject matter, various modifications and changes thereto can be made by persons skilled in the art without departing from the scope and spirit of the invention.

What is claimed is:

1. A measurement system for conducting measurements on a device-under-test (DUT), wherein impedance is controlled or varied over a set of measurement conditions and a parameter or set of parameters measured for each measurement condition, the system comprising:
   a passive impedance controlling tuner;
   a signal transmission line, the passive impedance controlling tuner including a signal transmission line segment as at least part of the signal transmission line;
   a signal coupling device coupled in a non-contacting relationship to the signal transmission line between a signal port of the DUT and the passive impedance controlling tuner for sampling signals propagating between the passive impedance controlling tuner and the DUT to allow measurement of an actual impedance presented to the DUT with the DUT in place in the measurement system during measurement of DUT characteristics;
   measurement system equipment for receiving response signals from the signal coupler; and
   wherein the measurement system is configured to conduct said measurement of DUT characteristics without pre-characterizing said passive impedance controlling tuner.

2. The system of claim 1, wherein the signal coupling device is mounted in a fixed position relative to the DUT.

3. The system of claim 1 wherein the signal coupling device is a separate device relative to the passive impedance controlling tuner.

4. The system of claim 1, wherein the signal coupling device is integrated with the passive impedance controlling tuner.

5. The system of claim 1, wherein the DUT is selected from the group comprising power transistors, power FETs or other power amplifying devices, small-signal low noise transistors, amplifying devices, frequency translating devices, frequency multipliers, two-terminal devices, three-terminal devices, and mixers.

6. The system of claim 1, wherein the passive impedance controlling tuner is selected from the group consisting of slide-screw tuners, double slug tuners, stub tuners and solid state tuners.

7. The system of claim 1, wherein the passive impedance controlling tuner is manually controlled.

8. The system of claim 1, wherein the passive impedance controlling tuner is automated with computer control.

9. The system of claim 1, wherein the signal coupling device is selected from the group consisting of a directional coupler, a directional bridge, a voltage-current probe, or a directional current probe.

10. The system of claim 1, wherein said DUT characteristics comprises a set of load pull parameters.

11. The system of claim 1, wherein the signal coupling device is adapted to allow measurement of phases and amplitudes of said sampled signals.

12. A method for using a measurement system including a passive impedance-controlling tuner and a signal transmission line, the tuner including a signal transmission line segment as at least part of the signal transmission line, the method comprising a sequence of the following steps:
   coupling a signal coupling device in a non-contacting relationship to the signal transmission line of the measurement system to allow measurement of an impedance presented to a device-under-test (DUT) with the DUT in place;
   for DUT measurements, without pre-characterizing the tuner, setting the impedance tuning to a setting;
   using the signal coupling device to measure an actual impedance presented to the DUT after the impedance tuning setting is set; and
   conducting measurements of the DUT using the measurement system.

13. The method of claim 12, wherein said setting the impedance tuning further comprises:
   setting the tuner to a new tuner impedance determined by an offset between a target impedance and the measured actual impedance;
   measuring an actual impedance presented to the DUT at the new tuner impedance setting; and
   iterating said steps of setting the tuner to a new tuner impedance and measuring the actual impedance until a desired impedance accuracy is achieved.

14. The method of claim 12, wherein said conducting measurements of the DUT comprises:
   measuring a set of load pull parameters.

* * * * *